United States Patent [19]

Kawakami

[11] Patent Number: 4,889,069
[45] Date of Patent: Dec. 26, 1989

[54] SUBSTRATE COATING EQUIPMENT

[75] Inventor: Kazushi Kawakami, Okayama, Japan

[73] Assignee: Tazmo Co., Ltd., Japan

[21] Appl. No.: 274,882

[22] Filed: Nov. 22, 1988

[30] Foreign Application Priority Data

Nov. 23, 1987 [JP] Japan .................................. 62-295904

[51] Int. Cl.[4] .......................... B05C 11/08; C23F 1/02
[52] U.S. Cl. ...................................... 118/50; 427/240; 118/52
[58] Field of Search ...................... 118/50, 52; 427/240

[56] References Cited
FOREIGN PATENT DOCUMENTS 0087069 5/1984 Japan ...................................... 118/52

Primary Examiner—Sam Silverberg
Attorney, Agent, or Firm—William A. Drucker

[57] ABSTRACT

This invention relates to a coating equipment to be used for coating a coating solution (coating diffusion agent, photo-resist agent, etc.) on a film which forms patterns of photo mask substrates (hereinafter merely called "substrates") used for production of reticle and photo masks or of glass substrates used for liquid crystal display. It features that said coating equipment comprises of a substrate table (spin head) having vacuum suction holes to set and fix said substrates being formed on the upper part of the spindle, a vessel for wrapping said spin head consisting of a vessel body having a peripheral side wall of a certain fixed height and its coverlid means, and both said vessel body and coverlid being able to be separated, a plurality of small holes and tubes being provided at the lower part of said peripheral side wall with a prompt interval, a doughnut-like cup being arranged and placed so that said doughnut-like cut can wrap said vessel of the above structure inside the center portion of said cup, an air suction hole whose height is a little larger than the outer diameter of said small holes or tubes being drilled and provided on the internal periphery of said cup, and the bottom portion of said cup being interconnected to a pipe furnished with an exhaust fan.

5 Claims, 5 Drawing Sheets

SUBSTRATE COATING EQUIPMENT

BACKGROUND OF THE INVENTION

In order to coat a coating diffusion agent or photo resist solution, etc. on various kinds of substrates (circular or rectangular type), it is general that a rotary coating equipment in which rotary centrifugal force of a spindle is utilized has been used.

In this rotary coating equipment, a substrate is adsorbed and retained to the upper surface of said spindle. Said coating solution or agent is dropped on the center of the surface of said substrate with said spindle stopped. After that said spindle is started and said coating solution or agent is spread to the whole surface of said substrate by virtue of centrifugal force of said spindle. At the same time, unnecessary solution is splashed out outside said substrate, thereby causing a film of said coating solution or agent (diffusion agent or photo resist agent) to be made uniform in thickness on the surface of said substrate. However, if such coating film is formed by a rotary coating equipment of the above structure, the peripheral portions of the whole surface of a coating solution or agent on said substrate may be adversely influenced by wind or aerial stream which is generated by rotation of said spindle, and said peripheral portions may be first dried, thereby causing the viscosity to become higher and higher. As a result, finally said coating solution or agent at said peripheral portions is hardened. Therefore, in this conventional rotary coating equipment, it is very difficult to coat said coating solution or agent uniformly or to form a uniform film thickness of said coating solution or agent on said substrate. The larger a substrate becomes, the larger this tendency (or influence) may become. In addition, if a substrate is rectangular, this tendency (or influence) may become a great problem.

As a method for unifying the coated film thickness, another coating equipment shown in FIG. 5 has been proposed, comprising that a substrate is placed on the upper surface of a spindle "1'" and a vessel "3'" which rotates in synchronization with said spindle is so composed that it can wrap said substrate "1'" placed on said spindle. However, coating solution or agent which becomes unnecessary in formation of coating film on said substrates is splashed out to the bottom and the side walls of said vessel "3'" outside said substrate. Therefore, it is impossible to continuously treat and coat as spinning, and the productivity is very poor.

OBJECTS OF THE INVENTION

Principal object of the present invention is to solve problems described in the above. According to the equipment disclosed by the present invention, influences of wind or aerial stream which is generated in accompanying with the rotation of spindle can be prevented, thereby causing uniform film of coating to be formed. Besides, unnecessary amount of coating solution or agent which may be splashed out due to rotary centrifugal force can be easily discharged outside said vessel through small holes and tubes which are provided at said vessel. Therefore, it is easily possible smoothly and continuously to coat said coating solution or agent on said substrate uniformly. In addition, it is remarkably great that the equipment disclosed by the present invention contributes to increasing the quality of substrates and promoting the increase of production. These and other objects of the present invention will be made apparent by the following descriptions and specification and/or drawings attached herewith.

DESCRIPTION OF THE PREFERRED EMBODIMENT (Example I of the preferred embodiments)

Figure 1:
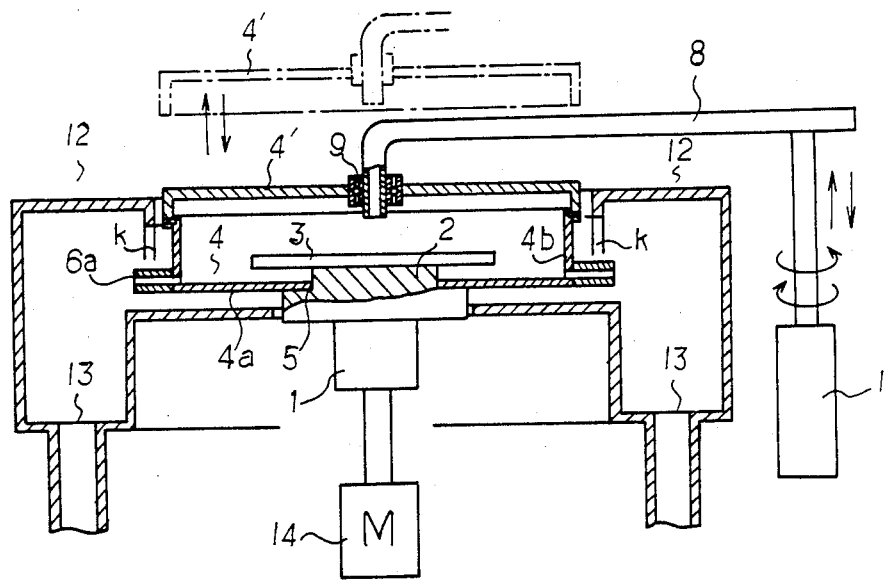
FIG. 1 is a rough sectional view of the equipment disclosed the present invention.

In reference with FIG. 1, a spindle is indicated with "1". A spin head "2" is furnished with a vacuum suction means on the upper part of said spindle "1". A substrate "3" is adsorbed to said spin head "2". A vessel "4" and its coverlid member "4'" are placed and arranged so that they can wrap said substrate "3", and they are so composed as shown below.

Figure 2:
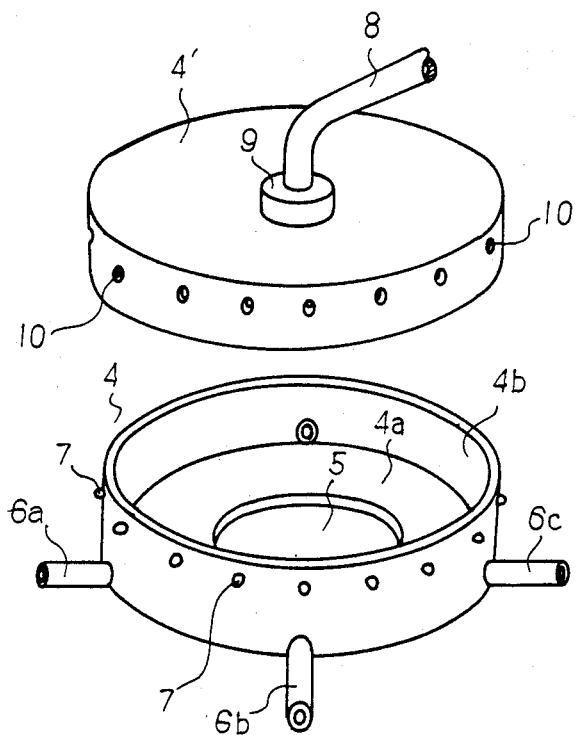
FIG. 2 is a part perspective view of a vessel and its coverlid member attached to the equipment disclosed by the present invention.

In reference with FIG. 2, "4a" is the bottom plate of said rotary vessel body, and the central portion of said bottom plate "4a" is furnished with a through hole "5" into which said spin head "2" is projected. At the same time, said bottom plate "4a" is so composed as to be just like a bowl by means of peripheral side wall "4b" having a certain fixed height which stands upright at the periphery of said bottom plate "4a". And said bowl-like outer peripheral portion is furnished with a plurality of small holes or tube pipes "6a", "6b", "6c" . . . Dog pieces "7" are placed and projected on the upper part of said outer peripheral surface of said peripheral side wall "4b". Said dog pieces engageable with and disengageable from a coverlid member "4'" described in details later.

Said coverlid member "4'" is furnished with a nozzle tube "8" by means of a hub member "9" for dropping said coating solution or agent at the center of said coverlid member "4'", and said nozzle tube "8" is rotatably mounted. In addition, openings "10" are provided at the peripheral flange portion of said coverlid member "4'" so that said dog pieces "7" can be elastically engaged with. A fluid cylinder "11" can elevate and lower said nozzle tube "8", by which said coverlid member "4'" is supported, in a certain fixed range of height by means of a piston rod attached to said fluid cylinder. As said fluid cylinder "11'" turns like a fan-shaped locus by means of gears mechanism not illustrated here, said coverlid member "4'" can be escaped upwards to a place where said coverlid member "4'" does not hinder replacement of substrates.

A doughnut-like cup "12" is so composed that the internal center portion of said cup "12" can wrap said vessel body "4" and said coverlid member "4'", and an air suction hole "k" whose height is a little larger than the outer diameter of said small holes or tube pipes "6a", "6b", "6c" . . . is drilled on the internal peripheral face of said cup "12". In addition, a waste solution hole "13" is prepared at the bottom of said cup "12", which is interconnected to a pipe furnished with a fan (not illustrated).

In the above structure, the bottom plate "4a" of said vessel body "4" is mounted on the upper surface of said spindle, thereby causing said coverlid member "4'" and said vessel body "4" to integrally rotate with said coverlid member "4'" engaged with said vessel body "4". "14" is a drive motor.

Next, the action and/or operation of the equipment disclosed by the present invention is described in details below. Said coverlid member "4'" is elevated by operation of said fluid cylinder "11" and turns just like a fan-shaped locus, thereby causing the upper portion of said vessel body "4" to be opened. Then, a substrate "3" is adsorbed to said spin head. Next, said coverlid member "4'" is returned to its original position and is engaged with said vessel body "4". At the same time, said vessel body "4" rotates together with said coverlid member "4'" by drive of said motor "14". Thus said coating solution or agent on said substrate "3" is coated and spread by centrifugal force for forming a coating film of said coating solution or agent. Said substrate "3" is coated with said coating solution or agent in the atmosphere of said coating solution or agent in an enclosed vessel, thereby causing said substrate not to be influenced by any wind or aerial stream. Therefore, completely uniform coating film can be secured.

At this time, unnecessary amount of coating solution or agent which may be splashed by rotary centrifugal force can be automatically discharged or exhausted by tube pipes "6a'", "6b", "6c" . . . . , which are provided and projected on the bottom portion of said enclosed vessel, outside said vessel. In details, as said spindle "1" rotates, some inclination (or difference) of pressure is produced from the tip ends of respective tube pipes "6a", "6b", "6c" and the hole portion of said vessel body. That is, the pressure becomes low at the tip ends of said tube pipes and high pressure is produced at the hole portion of said vessel body. For this reason, unnecessary amount of said coating solution or agent which is stored at the side wall portions at the bottom of said vessel body can be automatically discharged or exhausted outside said vessel body by virtue of difference of pressure. Therefore, when said coverlid member "4'" is released or opened from said vessel body "4" after the coating treatment is finished, a new substrate "3" is immediately adsorbed on said spin head "2" instead of taking out said substrate "2". Hence, the same operation as above is repeatedly carried out.

(Example II of the preferred embodiment)

Figure 3:
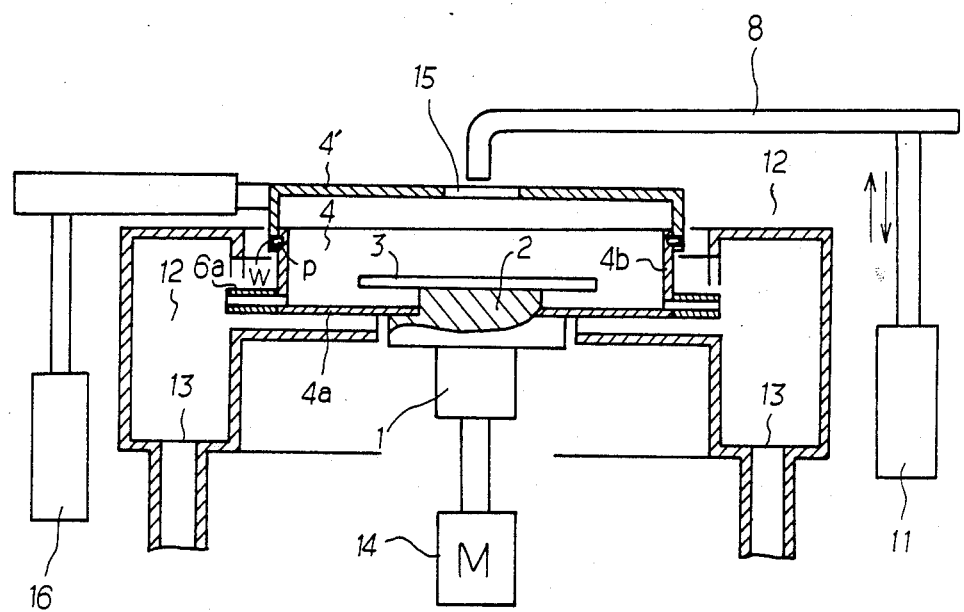
FIG. 3 and FIG. 4 are a rough sectional view of the 2nd and the 3rd preferred embodiments of the present invention.

FIG. 3 is a partial longitudinal sectional view of another embodiment. In the above embodiment disclosed by the present invention, said coverlid member "4'" is integrally supported at said nozzle tube "8". However, in this embodiment, both said coverlid member "4'" is separated from said nozzle tube "8", and said coverlid member "4'" is furnished at the center thereof with a hole "15" in which the tip end of said nozzle tube "8" is inserted.

In this preferred embodiment, "16" is another fluid cylinder by which said coverlid member "4'" is elevated and lowered in a certain fixed range of height, and said fluid cylinder "16" is so composed that it can turns said coverlid member "4'" just like a fan-shaped locus by means of a gears means (not illustrated) up to a place where said coverlid member "4'" does not hinder replacement and/or setting of subsequent substrates "3", and all the other composition is the same as those of the above example I of the preferred embodiment.

(Example III of the preferred embodiment)

Figure 4:
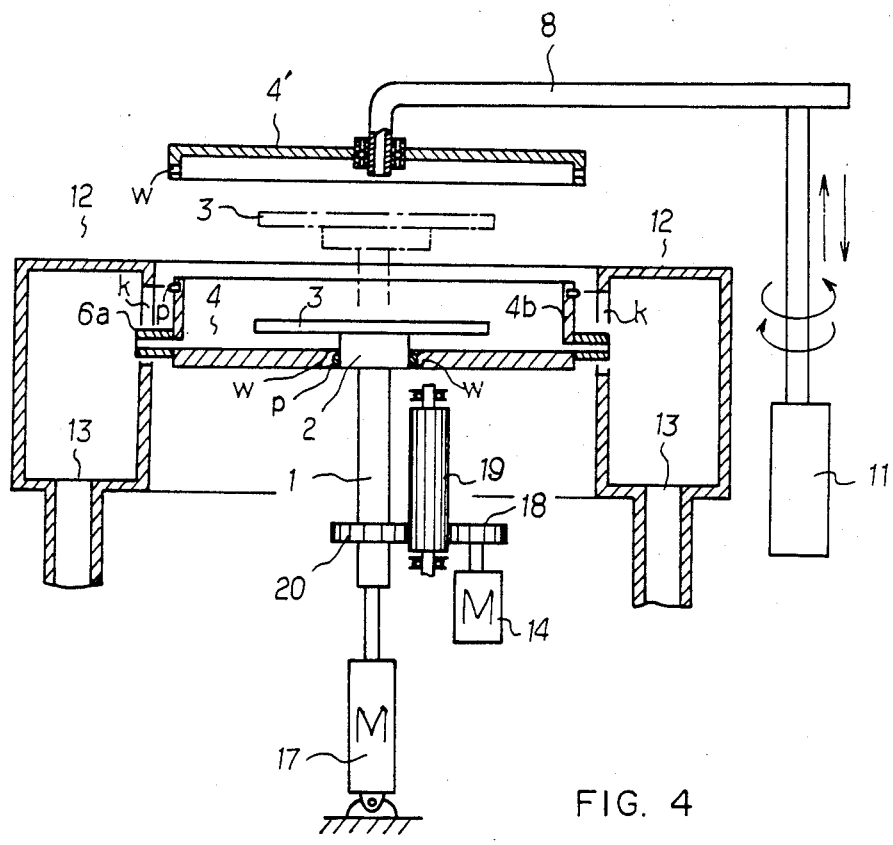
Figure 5:
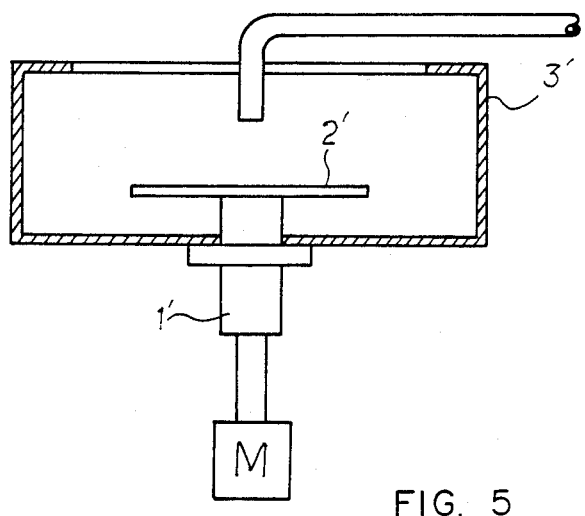
FIG. 5 is a rough sectional view of a conventional equipment.

FIG. 4 is a partial longitudinal sectional view of still another embodiment. In this preferred embodiment, the chuck head "2" of said spindle can be elevated and lowered, separating from said vessel body "4" when in the example of the preferred embodiment said coverlid member "4'" is escaped upwards up to a certain fixed height together with said nozzle tube "8" to ensure that said substrate "3" is mounted and dismounted on a transfer line of said substrates "3". That is, said spindle "1" is elevated and lowered in a certain fixed range of height by means of operation of a fluid cylinder "17", and said substrate "3" is mounted at and dismounted from said chuck head "2" at the upper limit of the stroke of fluid cylinder and said coating solution or agent is given to said substrate "3" at the lower limit of said stroke. At this time, said chuck head "2" is engaged with and disengaged from said vessel body "4" by prompt engagement and disengagement of dog pieces "p", which are elastically built in the outer periphery of said chuck head "2", with and from a through hole "w" drilled at the internal periphery of said vessel body "4". A motor "18" and gears "19" and "20" are provided to drive said spindle "1", and all the other composition is the same as that of the example I of the preferred embodiment.

As in this example of the preferred embodiment said substrate "3" can be mounted and dismounted for replacement on the transfer line of said substrates, totally automated work can be efficiently carried out. So, it is remarkably more excellent than the conventional equipments.

Having described by invention, what is claimed as new and desired to be secured by Letters Patent is;

1. A spin coating apparatus comprising;
    (1) a spin head having a vacuum adsorption hole to set and fix a substrate on the upper surface of a spindle,
    (2) A vessel means which rotates integrally with said spin head consisting of a vessel body having a peripheral side wall of a certain fixed height and a coverlid member in order to enclose said spin head, said coverlid member being able to be engaged with and disengaged from said vessel body, said peripheral sidewalls having a plurality of small holes or tube pipes at the lower peripheral part of said peripheral side wall,
    (3) a doughnut-like cup being placed and arranged so as to wrap said vessel means within the center portion of said cup, said cup having an air suction hole, whose dimension is larger than the outer diameter of said small holes or said tube pipes and is located on the internal periphery of said cup, so that excess coating can be exhausted thru said tube pipes or small holes via said air suction hole and the bottom of said cup is interconnected to a pipe equipped with an exhaust fan.

2. In an apparatus claimed in the claim 1, wherein a nozzle tube is provided at the center portion of a coverlid member for dropping a coating solution or agent, and said nozzle tube is linked with a piston rod of said fluid cylinder, thereby causing both said coverlid member and said nozzle tube to be elevated and lowered in a certain fixed range of height.

3. In an apparatus claimed in the claim 1, wherein the center part of said cover lid member has a through hole, into which a nozzle tube for dropping a coating solution or agent is inserted, said nozzle tube and said coverlid member are linked to a piston rod of different fluid cylinders, thereby causing said nozzle tube and said coverlid member to be elevated and lowered.

4. In an apparatus claimed the claim 2, wherein said spin head is formed on the upper part of said spindle and wherein the bottom portion of said vessel body coacts with said spindle so that said spindle can be separated from said vessel body and wherein a fluid cylinder elevates and lowers said spindle to a fixed height cylinder in a certain fixed range of height.

5. In an apparatus claimed in claim 3, wherein said spin head is formed on the upper part of said spindle and wherein the bottom portion of said vessel body coacts with said spindle so that said spindle can be separated from said vessel body and wherein a fluid cylinder elevates and lowers said spindle to a fixed height by which said spin head is formed at the upper part thereof, and the bottom portion of said vessel body, by which said spin head is enclosed, are so composed as to be separated from each other for engagement and disengagement, and said spindle is so composed as to be elevated and lowered by operation of said fluid cylinder.

* * * * *